United States Patent
Miyamoto et al.

(10) Patent No.: US 7,391,265 B2
(45) Date of Patent: Jun. 24, 2008

(54) AMPLIFIER UNIT AND OPTICAL DISC DRIVE

(75) Inventors: Shinichi Miyamoto, Osaka (JP); Yousuke Kuroiwa, Osaka (JP); Masaya Ueda, Osaka (JP); Hideo Fukuda, Kyoto (JP); Hiroshi Yamaguchi, Osaka (JP); Masaki Taniguchi, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 117 days.

(21) Appl. No.: 11/430,241

(22) Filed: May 9, 2006

(65) Prior Publication Data

US 2006/0202761 A1    Sep. 14, 2006

(30) Foreign Application Priority Data

May 12, 2005   (JP)   .............................. 2005-139189
Feb. 6, 2006   (JP)   .............................. 2006-027813

(51) Int. Cl.
*H03F 3/45* (2006.01)
*H03F 3/08* (2006.01)

(52) U.S. Cl. ........................................ 330/260; 330/308
(58) Field of Classification Search ........................ None
See application file for complete search history.

(56) References Cited

U.S. PATENT DOCUMENTS

| | | | | |
|---|---|---|---|---|
| 3,327,235 A | * | 6/1967 | Hull | 330/255 |
| 6,016,301 A | * | 1/2000 | Takasawa et al. | 369/112.17 |
| 6,066,985 A | * | 5/2000 | Xu | 330/253 |
| 6,114,686 A | * | 9/2000 | Funahashi | 250/214 A |
| 6,753,734 B2 | * | 6/2004 | Arell et al. | 330/296 |
| 2007/0228258 A1 | * | 10/2007 | Yamaguchi et al. | 250/214 A |

FOREIGN PATENT DOCUMENTS

JP      10-107563      4/1998

* cited by examiner

*Primary Examiner*—Robert J. Pascal
*Assistant Examiner*—Alan Wong
(74) *Attorney, Agent, or Firm*—Steptoe & Johnson LLP

(57) ABSTRACT

An amplifier unit is provided, with which the need for manufacturing a photoelectric conversion IC in Bi-CMOS process is eliminated, and relatively low process cost of the photoelectric conversion IC is achieved. The input section of a buffer (the base of a transistor Q5) is connected with a plurality of patterns of phase compensation circuits each including a resistor and a capacitor connected in series. A bipolar transistor (Q6) is interposed between a positive power supply line and a capacitor (C2) forming a capacitance of the phase compensation circuit. By switching on/off the bipolar transistor (Q6), the capacitance value and resistance value of the phase compensation circuit are switched. Since the bipolar transistor (Q6) is interposed between the capacitor (C2) and the positive power supply line, base current (Isw) acting as a switch signal does not affect the amplifier unit.

7 Claims, 18 Drawing Sheets

AMPLIFIER UNIT AND OPTICAL DISC DRIVE

FIELD OF THE INVENTION

The present invention relates to an amplifier unit used in a photoelectric conversion IC or the like for an optical disc drive, and to an optical disc drive.

BACKGROUND OF THE INVENTION

In recent years, as disc rotation speeds have increased during the reading of data in optical disc drives typified by a CD-R drive and a DVD-R drive and data have been written to an optical disc, there has been a demand for photoelectric conversion ICs which can correctly amplify both of a high-frequency signal during the reading of data and a pulsed signal during the writing of data. Further, photoelectric conversion ICs which can accommodate different standards of optical discs are demanded.

Such photoelectric conversion ICs can be achieved by switching frequency characteristics and gains (amplification factors) in current-voltage converters which convert current from photo diodes to voltage.

FIG. 18 is a diagram showing an example of a current-voltage converter included in a conventional photoelectric conversion IC.

The current-voltage converter comprises an amplifier APi for converting a current signal from a photo diode PDi to a voltage signal, a feedback capacitor Cf and a feedback resistor Rf of the amplifier APi, and an analog switch circuit (junction FET) 14 for switching the gains and feedback capacitances of the amplifier APi.

The cathode of the photo diode PDi connects to the inverting input terminal of the amplifier APi. Meanwhile, the anode of the photo diode PDi is grounded. The inverting input terminal of the amplifier APi receives a light-receiving current signal from the photo diode PDi and the noninverting input terminal of the amplifier APi is fed with intermediate voltage Vs (½ Vcc) of reference voltage Vcc.

The amplifier APi comprises a differential amplifier circuit 11 for current-voltage conversion which converts the light-receiving current signal from the photo diode PDi to a voltage signal, a phase compensation section 12 for performing selected phase compensation on a signal from the differential amplifier circuit 11, and an output circuit 13 for amplifying, in a push-pull manner, a signal whose phase has been compensated by the phase compensation section 12. The phase compensation section 12 includes an analog switch circuit (junction FET) 14. The analog switch circuit 14 is turned on/off in response to a control signal Vm. In response to the on/off of the analog switch circuit 14, the gain of the amplifier APi is switched, and simultaneously the feedback capacitance of the amplifier API and the resistance value and the capacitance value of the phase compensation section are also switched.

In this way, the current-voltage converter makes it possible to adjust the frequency characteristics of the amplifier APi.

The conventional photoelectric conversion IC including the current-voltage converter configured thus is able to change the gain of the amplifier APi so as to obtain a constant output voltage, even when the power of light (amount of reflected light) reflected from an optical disc and incident on the photo diode PDi is varied among the different standards of optical discs or due to whether data are written or read. Further, the conventional photoelectric conversion IC is able to adjust frequency characteristics depending on the different standards of optical discs and the state of writing or reading by changing the feedback capacitance of the amplifier APi and the resistance value and capacitance value of the phase compensation section (For example, Japanese Patent Laid-Open No. 10-107563).

DISCLOSURE OF THE INVENTION

However, there is a variety of different standards of optical discs including DVD±R, ±RW, and RAM at present and the standards vary in recording speed. When the different recording speeds are handled by a single photoelectric conversion IC, the number of stages of switching the gain of the amplifier is increased to, for example, ten stages. Thus the ratio of the maximum gain and the minimum gain is increased to, for example, forty to one. For this reason, when frequency characteristics are optimized for, for example, a high gain, the open loop gain of the amplifier may not sufficiently decrease at low gain, so that ringing and the like may degrade transient characteristics or the amplifier may oscillate. Therefore it is necessary to simultaneously switch the feedback capacitance of the amplifier and the resistance value and capacitance value of the phase compensation section to optimum values in each gain mode and optimize the frequency characteristics of the amplifier in all the gain modes.

In the conventional photoelectric conversion IC including the current voltage converter shown in FIG. 18, this problem can be handled by the provision of the analog switch element for switching the resistance value and capacitance value of the phase compensation section in the amplifier APi (amplifier unit). In the photoelectric conversion IC, however, a junction FET (MOS-FET or J-FET) is used as the analog switch element and thus the photoelectric conversion IC is manufactured in Bi-CMOS process, resulting in high process cost.

In consideration of the problem, the present invention has an object to provide an amplifier unit which can switch the resistance value and/or capacitance value of a phase compensation section in the amplifier unit, eliminate the need for manufacturing a photoelectric conversion IC in Bi-CMOS process, and achieve relatively low process cost of the photoelectric conversion IC. In order to attain the object, in the present invention, a bipolar transistor is used as a switch element for switching the resistance value and/or capacitance value of the phase compensation section.

Another object of the present invention is to provide an optical disc drive comprising, for example, a photoelectric conversion IC having a number of stages of switching gains and a large ratio between the maximum gain and the minimum gain and/or a photoelectric conversion IC capable of responding to kinds of recording speeds/reading/writing, wherein the frequency characteristics of an amplifier unit in the photoelectric conversion IC can be easily adjusted in response to the switching of gains, the switching of recording speeds, the switching of reading/writing and so on. In order to attain this object, in the present invention, a photoelectric conversion IC (photoelectric converter) for an optical disc drive comprises an amplifier unit in which a bipolar transistor is used as a switch element for switching the resistance value and/or capacitance value of a phase compensation section.

An amplifier unit of the present invention comprises a differential input section for receiving an input signal, a phase compensation section for performing phase compensation on a signal from the differential input section, an output section fed with the signal whose phase has been compensated by the phase compensation section, and a feedback resistor section for feeding back, to the differential input section, a signal outputted from the output section, the amplifier unit outputting, from the output section, a signal obtained by amplifying the input signal by means of a predetermined amplification factor determined by the resistance value of the feedback resistor section, the amplifier unit further comprising a bipolar transistor for performing a switching operation to switch the resistance value and/or capacitance value of the phase compensation section.

Further, an amplifier unit of the present invention comprises a differential input section fed with an input signal, a power supply line, a signal line for transmitting a signal from the differential input section, a phase compensation section which includes a plurality of phase compensation circuits disposed between the power supply line and the signal line and performs phase compensation on the signal from the differential input section, an output section which is connected to the signal line and receives the signal whose phase has been compensated by the phase compensation section, and a feedback resistor section for feeding back, to the differential input section, a signal outputted from the output section, the amplifier unit outputting, from the output section, a signal obtained by amplifying the input signal by means of a predetermined amplification factor determined by the resistance value of the feedback resistor section, the amplifier unit further comprising a bipolar transistor which is disposed between the power supply line and a capacitor for forming the capacitance value of at least one of the phase compensation circuits and performs a switching operation to switch the resistance value and/or capacitance value of the phase compensation section.

The amplifier unit of the present invention further comprises a current source which is connected to the bipolar transistor and operates in synchronization with the switching operation of the bipolar transistor so that the signal line includes no base current components of the bipolar transistor.

The amplifier unit of the present invention further comprises a current source which is connected between the bipolar transistor and the capacitor and operates in synchronization with the switching operation of the bipolar transistor so as to operate the bipolar transistor in an active region when the bipolar transistor is turned on.

According to the amplifier unit of the present invention, the power supply line is a positive power supply line and/or a ground power supply line and the phase compensation circuit is disposed between the signal line and the positive power supply line and/or the ground power supply line.

According to the amplifier unit of the present invention, the power supply line is a positive power supply line and a ground power supply line, the phase compensation circuits are respectively disposed between the signal line and the positive power supply line and between the signal line and the ground power supply line, the bipolar transistor is provided for each of the phase compensation circuits, and the phase compensation circuit connected to the positive power supply line and the phase compensation circuit connected to the ground power supply line can be selected by the bipolar transistor.

The amplifier unit of the present invention further comprises a low-pass filter connected to the base of the bipolar transistor.

An optical disc drive of the present invention is an optical disc drive responding to optical discs of a plurality of medium types, the optical disc drive comprising a photoelectric converter including a plurality of photo diodes each generating a current signal corresponding to an amount of light reflected from a loaded optical disc, a plurality of current-voltage converters each converting the current signal from the photo diode to a voltage signal, and an arithmetic section for performing operations using the voltage signal from the current-voltage converter, wherein the current-voltage converter or the arithmetic section includes the amplifier unit of the present invention.

According to the optical disc drive of the present invention, the feedback resistor section is a circuit for switching a resistance value, and the optical disc drive further comprises a mechanism for identifying the medium type of loaded optical disc, and a mechanism for reducing the resistance value of the feedback resistor section when the loaded optical disc has a high reflectivity and increasing the resistance value of the feedback resistor section when the loaded optical disc has a low reflectivity, respectively based on a medium type identification result.

The optical disc drive of the present invention further comprises a mechanism for adjusting, based on the medium type identification result of the loaded optical disc, the bias current value of a transistor for receiving the input signal, the transistor forming the differential input section.

The optical disc drive of the present invention further comprises a mechanism for causing the bipolar transistor to perform a switching operation in response to a temperature change.

According to the optical disc drive of the present invention, the bipolar transistor is switched on/off, so that when data is written on the optical disc, an output signal from the amplifier unit has a smaller group delay deviation than that during the reading of data from the optical disc, and when data is read from the optical disc, the output signal from the amplifier unit has a higher cutoff frequency than that during the writing of data on the optical disc.

The present invention makes it possible to switch the capacitance value and/or resistance value of the phase compensation section, thereby readily adjusting the frequency characteristics of the amplifier unit. Further, since the switch element for switching the resistance value and/or capacitance value of the phase compensation section is a bipolar transistor, it is possible to eliminate the need for manufacturing a photoelectric conversion IC in Bi-CMOS process and achieve relatively low process cost of the photoelectric conversion IC.

Moreover, according to the present invention, an optical disc drive comprises a photoelectric converter having a number of stages of switching gains and a large ratio between the maximum gain and the minimum gain or a photoelectric converter capable of responding to kinds of recording speeds/ reading/writing, wherein the frequency characteristics of the photoelectric converter can be easily adjusted in response to the switching of gains, the switching of recording speeds, the switching of reading and writing and so on.

DESCRIPTION OF THE EMBODIMENTS

The following will describe embodiments of the present invention in accordance with the accompanying drawings.

Embodiment 1

Figure 1:
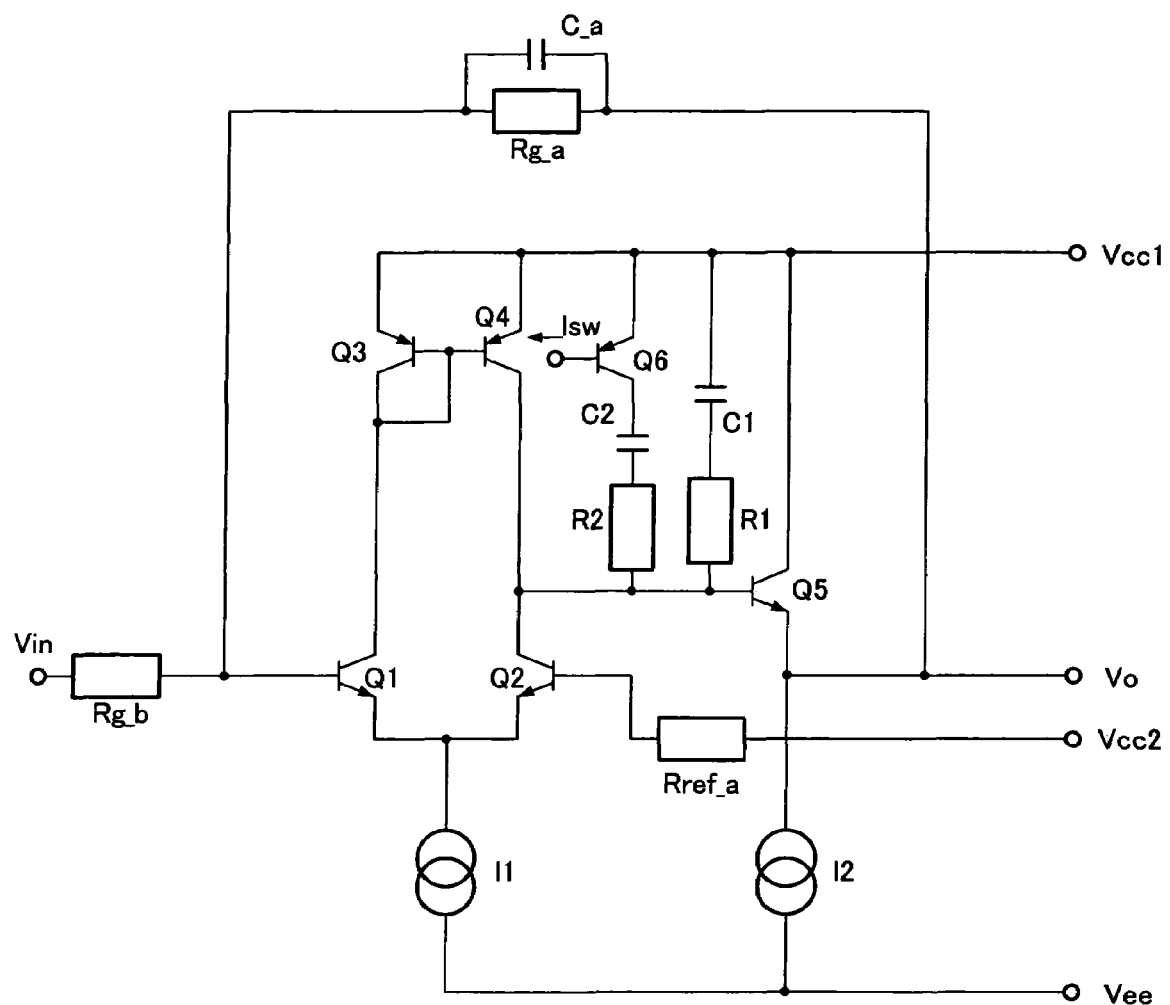
FIG. 1 is a diagram showing an example of the configuration of an amplifier unit according to Embodiment 1 of the present invention.

FIG. 1 is a diagram showing an example of the configuration of an amplifier unit according to Embodiment 1 of the present invention.

The amplifier unit of FIG. 1 comprises bipolar transistors Q1 to Q6, resistors Rg_a, Rg_b, Rref_a, R1, and R2, capacitors C_a, C1, and C2 and constant-current sources I1 and I2. The transistors Q1 to Q6, the resistors R1 and R2, and the capacitors C1 and C2 make up an amplifier. The amplifier unit further includes five terminals of a first input terminal Vin for inputting a signal to the inverting input terminal of the amplifier, a second input terminal Vcc2 for inputting a signal to the noninverting input terminal of the amplifier, an output terminal Vo for outputting a signal from the output terminal of the amplifier, a power supply terminal Vcc1 connecting to the positive power supply line of the amplifier, and a ground power supply terminal Vee connecting to the ground power supply line of the amplifier.

In FIG. 1, the transistors Q1 and Q2 form a differential amplifier circuit (differential input section). The output signal of the differential amplifier circuit is transmitted to the base of the transistor Q5 acting as a buffer (output section).

Since the transistor Q5 is operated by an emitter follower, the voltage amplification factor of the transistor Q5 is 1. The bases of the transistor Q1 and the transistor Q2 respectively act as the inverting input terminal and the noninverting input terminal of the amplifier, and the emitter of the transistor Q5 acts as the output terminal of the amplifier.

A phase compensation section for performing phase compensation on the output signal of the differential amplifier circuit is connected between the positive power supply line connecting to the power supply terminal Vcc1 and a signal line for transmitting the output signal of the differential amplifier circuit to the transistor Q5. Therefore the transistor Q5 is fed with the signal whose phase has been compensated by the phase compensation section.

The feedback resistor Rg_a (feedback resistor) for feeding back the output signal of the amplifier to the inverting input terminal is connected between the output terminal and the inverting input terminal of the amplifier. The amplifier unit is configured as an inverting amplifier circuit for amplifying an input signal from the first input terminal Vin relative to a signal from the second input terminal Vcc2.

In other words, the amplifier unit outputs a signal obtained by amplifying the input signal from the first input terminal Vin by a predetermined amplification factor (gain) which is determined by the resistance value of the feedback resistor Rg_a. The gain is expressed by -Rg_a/Rg_b where Rg_a represents the resistance value of the feedback resistor Rg_a and Rg_b represents the resistance value of the resistor Rg_b connecting to the inverting input terminal.

The input resistor Rg_b connecting to the inverting input terminal and the input resistor Rref_a connecting to the noninverting input terminal determine the impedances of the inverting input terminal and the noninverting input terminal, respectively. The feedback capacitor C_a connected in parallel with the feedback resistor Rg_a determines a feedback capacitance.

The phase compensation section includes a first phase compensation circuit made up of the capacitor C1 for phase compensation and the resistor R1, which are connected in series, and a second phase compensation circuit made up of the capacitor C2 for phase compensation and the resistor R2, which are connected in series. The PNP bipolar transistor Q6 used for a switch for switching the resistance value and capacitance value of the phase compensation section is connected between the positive power supply line and the capacitor C2 for forming the capacitance value of the second phase compensation circuit.

In other words, the resistance value and capacitance value of the phase compensation section are switched by the switching operation (on/off) of the PNP bipolar transistor Q6. To be specific, when the PNP bipolar transistor Q6 is turned off, the first phase compensation circuit in the phase compensation section performs phase compensation on the output signal of the differential amplifier circuit by using a capacitance value and a resistance value determined by the capacitor C1 and the resistor R1. When the PNP bipolar transistor Q6 is turned on, the first and second phase compensation circuits are connected in series in the phase compensation section to perform phase compensation on the output signal of the differential amplifier circuit by using a capacitance value and a resistance value determined by the capacitors C1 and C2 and the resistors R1 and R2.

According to the amplifier unit, it is possible to switch the capacitance value and resistance value of the phase compensation section, thereby readily adjusting the frequency characteristics of the amplifier unit. Moreover, the switch element for switching the resistance value and capacitance value of the phase compensation section is a bipolar transistor, so that the bipolar transistor is the only one transistor making up the amplifier unit. Therefore this amplifier unit makes it possible to eliminate the need for manufacturing a photoelectric conversion IC in Bi-CMOS process and achieve relatively low process cost of the photoelectric conversion IC.

The same effect can be obtained even when the capacitors and the resistors are interchanged in the connection of the phase compensation circuit.

Figure 2:
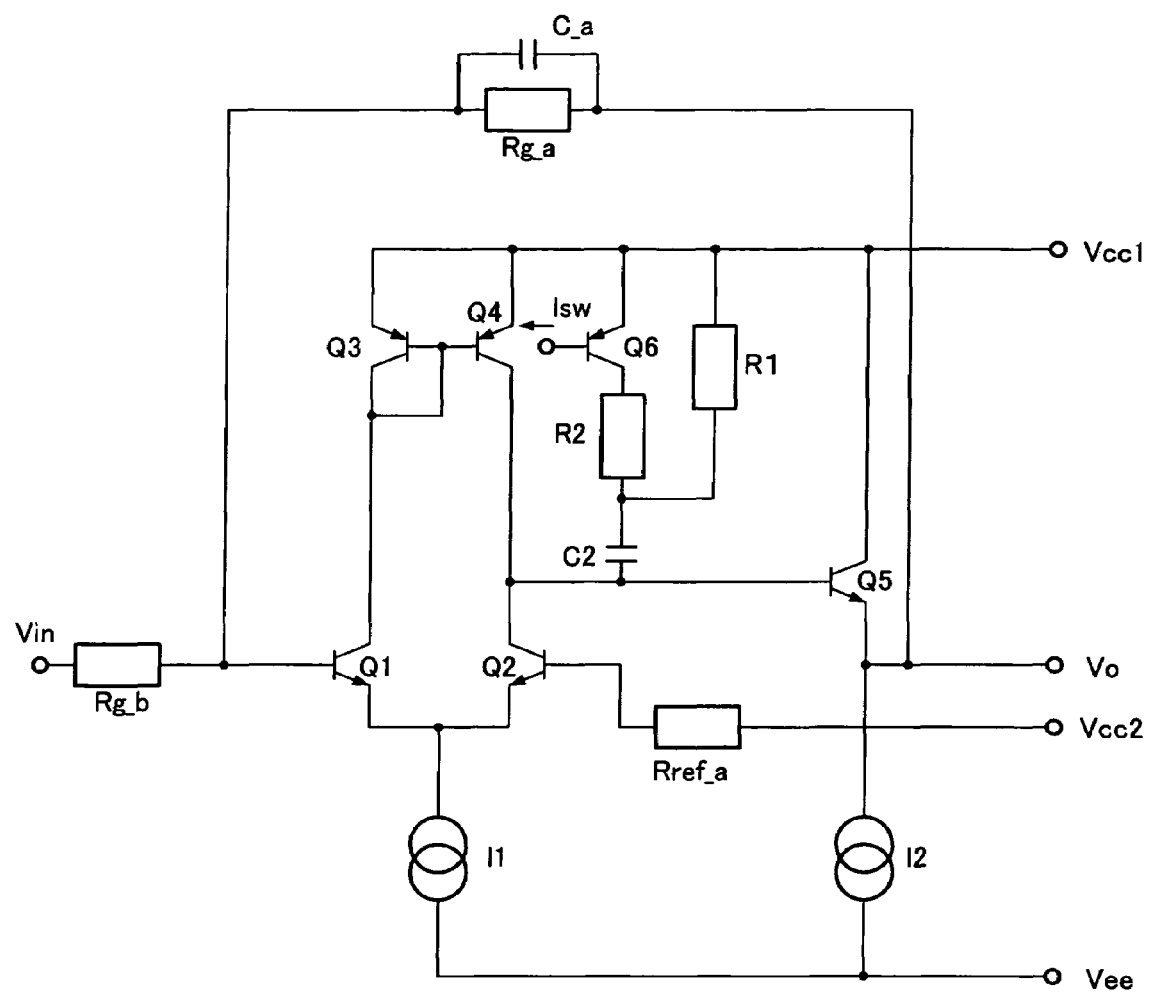
FIG. 2 is a diagram showing an example of the configuration of the amplifier unit according to Embodiment 1 of the present invention.

For example, even when only the resistance value of the phase compensation section can be switched as shown in FIG. 2, the frequency characteristics can be adjusted.

Figure 3:
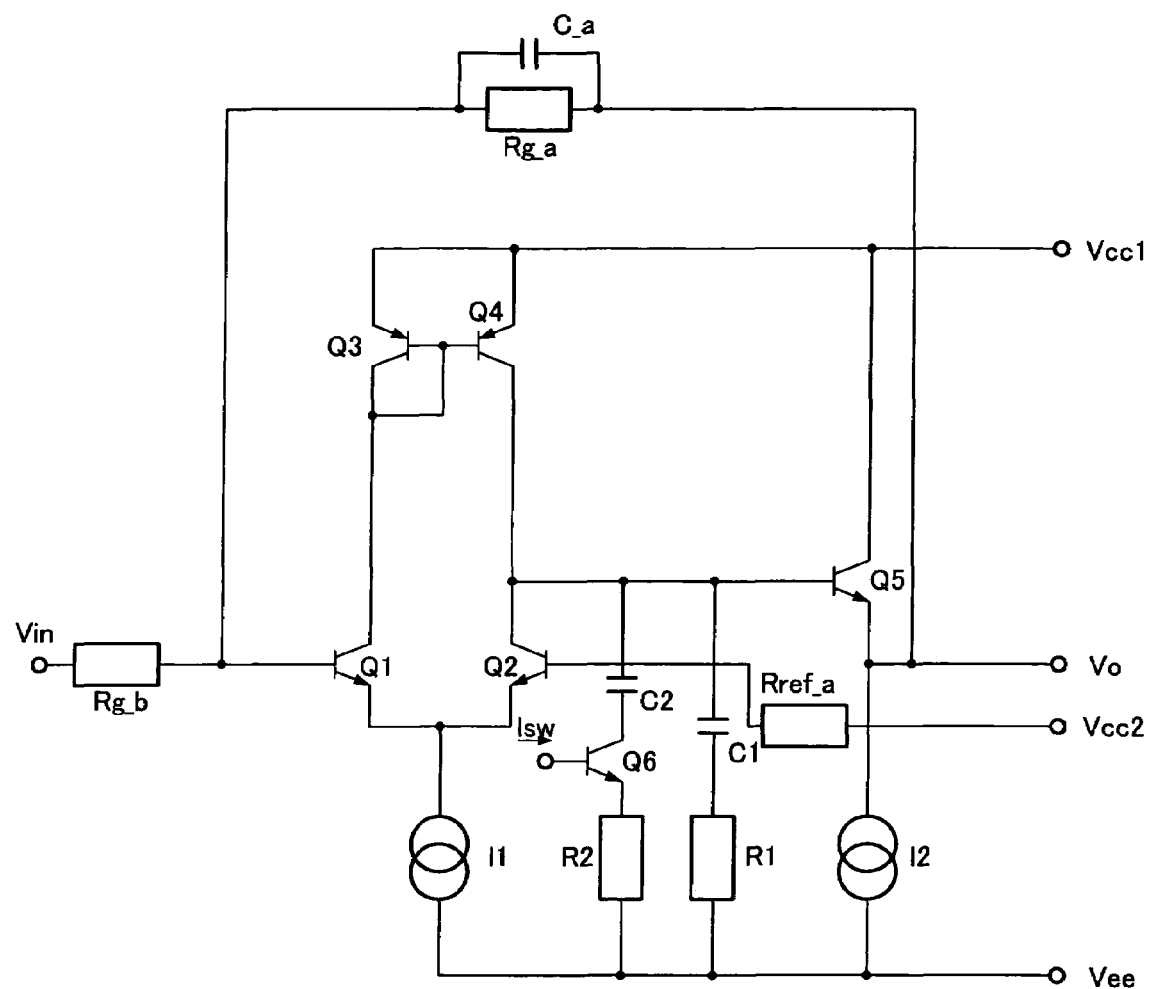
FIG. 3 is a diagram showing an example of the configuration of the amplifier unit according to Embodiment 1 of the present invention.

For example, as shown in FIG. 3, the phase compensation section may be disposed between the signal line and the ground power supply line connecting to the ground power supply terminal Vee. In this case, the NPN bipolar transistor Q6 used for a switch for switching the resistance value and capacitance value of the phase compensation section is disposed between the ground power supply line and the capacitor C2 of the second phase compensation circuit.

In this way, the bipolar transistor used for a switch for switching the resistance value and/or capacitance value of the phase compensation section is disposed between the power supply line and the capacitor forming the capacitance value of the phase compensation circuit, so that the frequency characteristics can be readily adjusted by the switching operation.

Therefore, when the amplifier unit is used to configure the photoelectric conversion IC (photoelectric converter) of an optical disc drive having a number of stages of switching gains and a large ratio between the maximum gain and the minimum gain or the photoelectric conversion IC of an optical disc drive capable of responding to kinds of recording speeds/reading/writing, it is possible to readily adjust the frequency characteristics of the photoelectric conversion IC in response to the switching of gains, the switching of recording speeds, the switching of reading/writing and so on. Further, as described above, the process cost of the photoelectric conversion IC can be relatively low.

Figure 4:
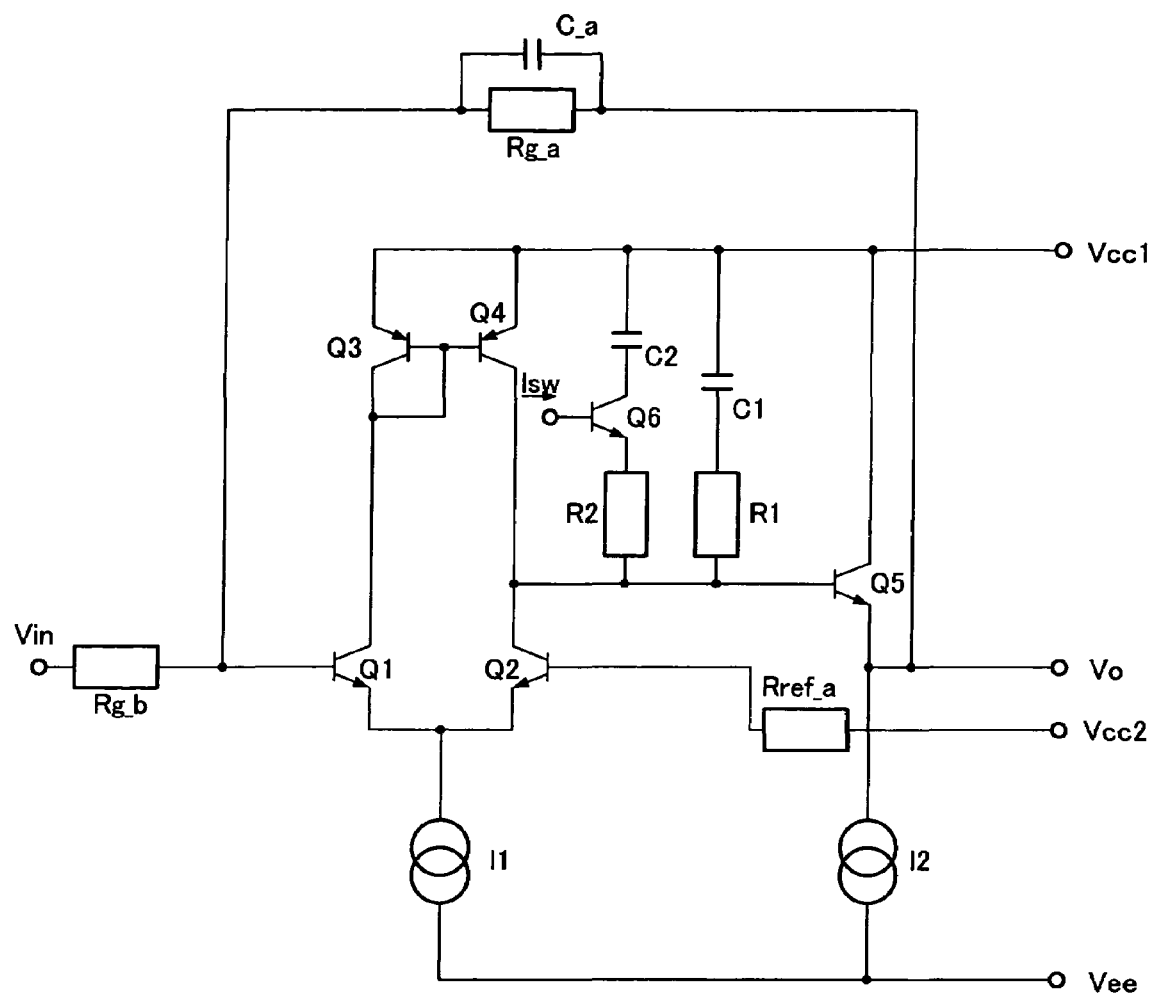
FIG. 4 is a diagram for explaining problems caused in a circuit by the position of a switch element.

For example, when the transistor Q6 and the capacitor C2 are interchanged in the connection of the amplifier unit as shown in FIG. 4, a problem arises. In this case, in order to pass a base current Isw to turn on the transistor Q6 in a saturation region, an NPN bipolar transistor is used as the transistor Q6. Therefore, when the NPN bipolar transistor Q6 is turned on, the base current Isw passes through the base of the transistor Q5 and the collector of the transistor Q2, and the DC operating point of the transistor Q5 and the transistor Q2 is displaced, causing problems such as a change of the frequency characteristics and the occurrence of offset voltage.

In contrast, when the amplifier unit is configured as shown in FIGS. 1 and 2, the bipolar transistor Q6 used for a switch for switching the resistance value and/or capacitance value of the phase compensation section is a PNP bipolar transistor. The base current Isw is thus supplied from the power supply terminal Vcc1 (positive power supply line) via the emitter of the PNP bipolar transistor Q6. Therefore the above problem does not occur.

When the amplifier unit is configured as shown in FIG. 3, the base current Isw passes through the ground power supply terminal Vee (ground power supply line) via the emitter of the NPN bipolar transistor Q6, so that the above problem does not occur.

Figure 5:
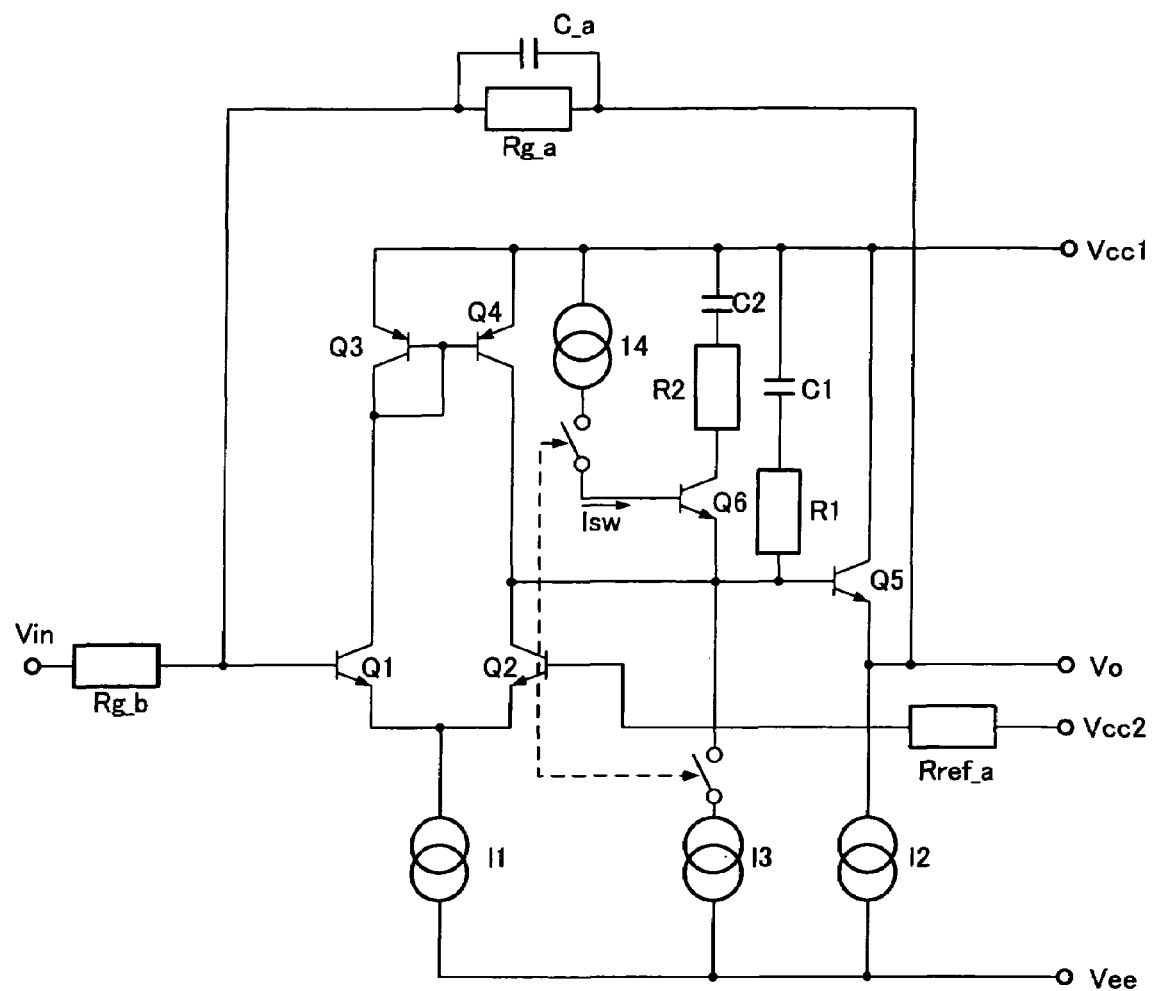
FIG. 5 is a diagram showing an example of the configuration of the amplifier unit according to Embodiment 1 of the present invention.

When the transistor Q6 and the capacitor C2 are interchanged in the connection, as shown in FIG. 5, a constant-current source I3 operating in synchronization with the operation of a constant-current source I4 (that is, the switching operation of the transistor Q6) for passing the base current of the transistor Q6 is connected to the emitter of the NPN bipolar transistor Q6, and the base current component from the emitter of the transistor Q6 is passed through the ground power supply line. Due to the operation of the constant-current source I3, the base current component of the transistor Q6 is not included in the signal line.

Figure 6:
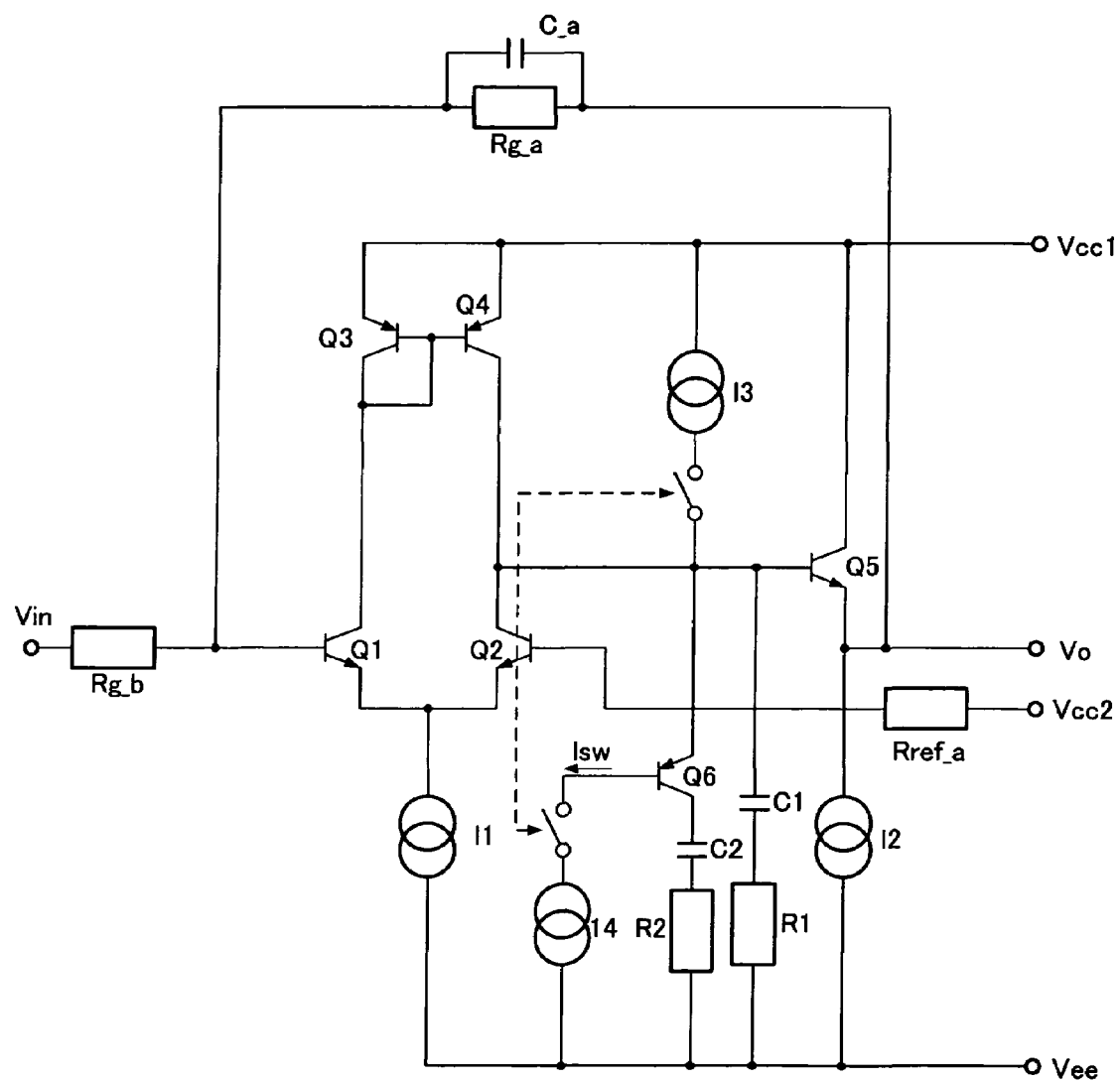
FIG. 6 is a diagram showing an example of the configuration of the amplifier unit according to Embodiment 1 of the present invention.

For example, as shown in FIG. 6, the constant-current source I3 operating in synchronization with the operation of the constant-current source I4 for passing the base current of the transistor Q6 may be connected to the emitter of the PNP bipolar transistor Q6, and the base current component from the emitter to the base of the transistor Q6 may be supplied from the positive power supply line. Due to the operation of the constant-current source I3, the base current component of the transistor Q6 is not included in the signal line.

When the amplifier unit is configured as shown in FIGS. 5 and 6, it is possible to prevent the base current Isw from passing through the base of the transistor Q5 and the collector of the transistor Q2, thereby causing no problems such as a change of the frequency characteristics and the occurrence of offset voltage.

Figure 7:
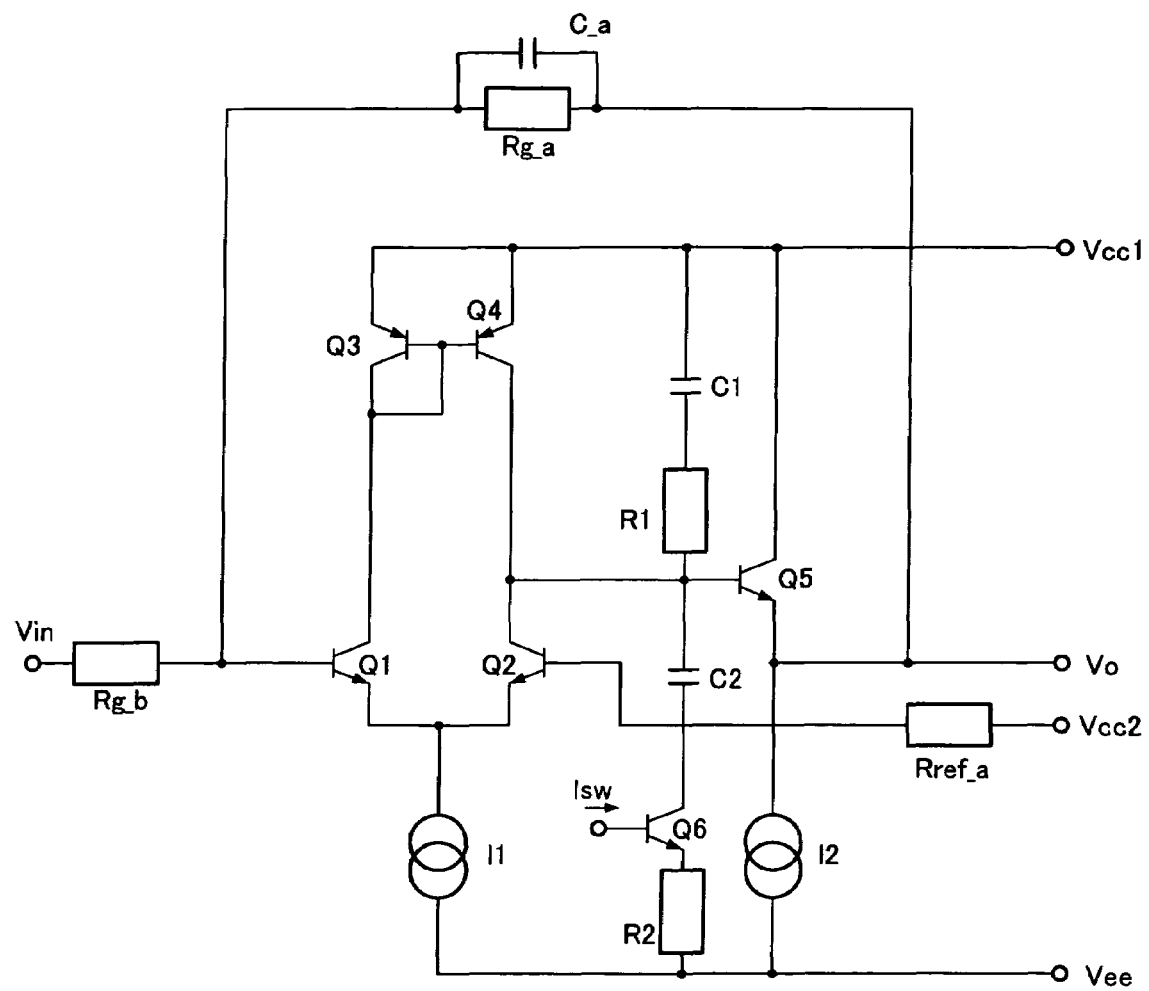
FIG. 7 is a diagram showing an example of the configuration of the amplifier unit according to Embodiment 1 of the present invention.

In the above explanation, the phase compensation circuit is provided between the signal line and the positive power supply line or between the signal line and the ground power supply line. For example, as shown in FIG. 7, phase compensation circuits may be provided between the signal line and the positive power supply line and between the signal line and the ground power supply line, respectively.

Figure 8:
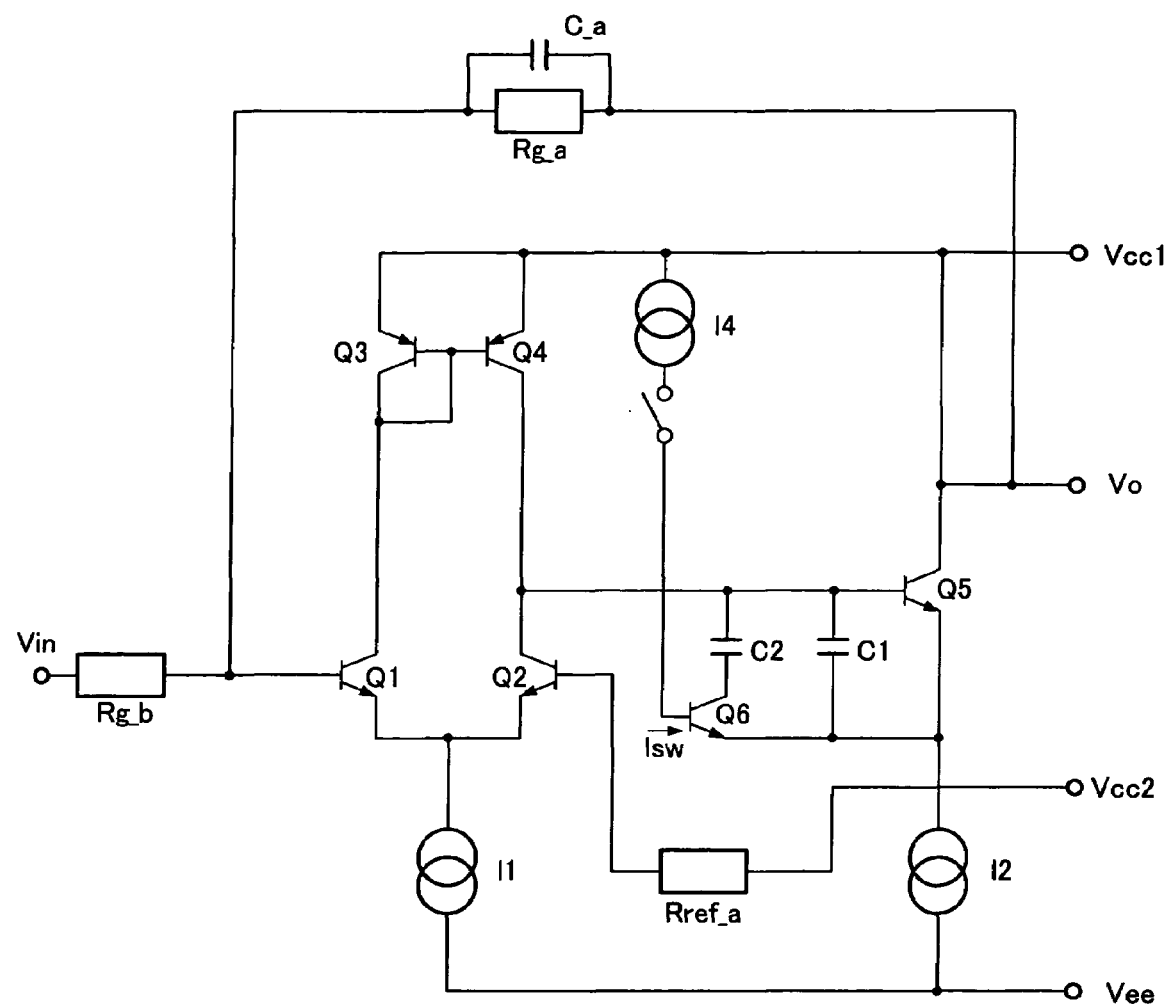
FIG. 8 is a diagram showing an example of the configuration of the amplifier unit according to Embodiment 1 of the present invention.

Generally in order to increase the open loop gain of the amplifier to improve the frequency characteristics, in some cases, the emitter of the transistor Q5 acting as a buffer (output section) is grounded. In this case, as shown in FIG. 8, the phase compensation circuit is provided between the signal line and the emitter of the transistor Q5. Further, in this case, it is desirable that the NPN bipolar transistor Q6 used for a switch for switching the capacitance value and/or resistance value of the phase compensation section be provided between the capacitor C2 for phase compensation and the emitter of the transistor Q5. In this configuration, the base current Isw passes through the constant-current source I2 via the emitter of the transistor Q6. Generally current supplied to the constant-current source I2 is much larger than the base current Isw and thus the base current Isw passing through the constant-current source I2 is negligible. The phase compensation circuit of FIG. 8 includes no resistors. Needless to say, resistors may be included.

When the transistor Q6 is disposed between the capacitor C2 and the signal line, the base current Isw passes through the collector of the capacitor Q2 via the emitter of the transistor Q6, a difference appears between the corrector currents of the transistor Q1 and the transistor Q2, and thus offset voltage occurs. Moreover, the temperature drift of the offset voltage degrades.

Figure 9:
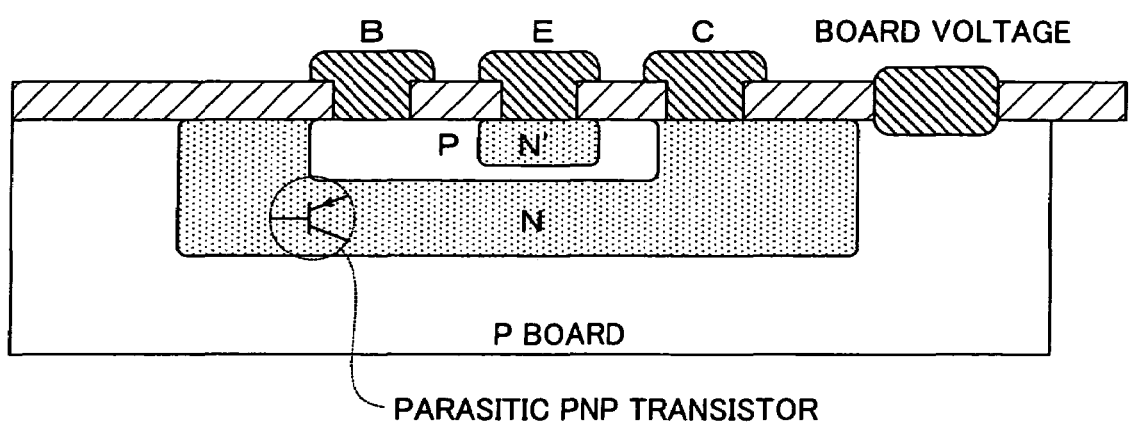
FIG. 9 is a sectional view showing a vertical-type NPN transistor.

Meanwhile, when the amplifier unit is made up of an integrated circuit (IC), a problem may occur due to the type of the transistor Q6 used for a switch for switching the resistance value and/or capacitance value of the phase compensation section. This is because NPN bipolar transistors used for ICs are mainly vertical-type transistors. In other words, when the transistor Q6 is an NPN bipolar transistor as shown in FIGS. 7 and 8, the saturated (switched-on) NPN bipolar transistor Q6 turns on a parasitic PNP transistor between the base, the collector, and the board shown in FIG. 9, the base current Isw of the NPN bipolar transistor Q6 passes through the board, and thus the turned-on transistor Q6 may be turned off.

In contrast, in the case of a vertical-type PNP bipolar transistor, problems caused by a parasitic transistor do not occur even in a saturation region. Therefore when a parasitic transistor may cause problems, the resistance value and/or capacitance value of the phase compensation section is switched by the PNP bipolar transistor, for example, as in the amplifier units of FIGS. 1 and 2.

Figure 10:
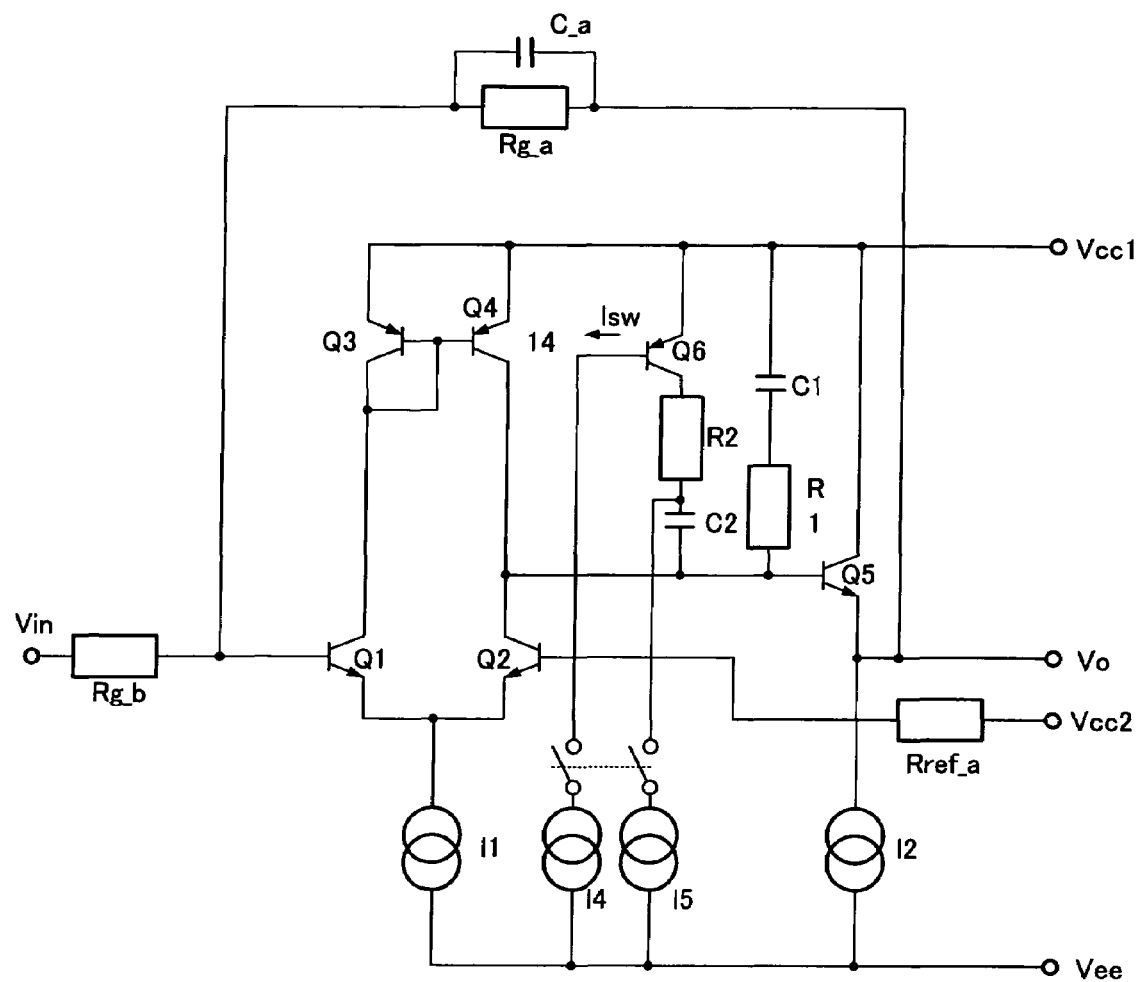
FIG. 10 is a diagram showing an example of the configuration of the amplifier unit according to Embodiment 1 of the present invention.

For example, the configuration of FIG. 10 may be used in which a constant-current source I5 operating in synchronization with the switching operation of the PNP bipolar transistor Q6 is connected to the collector of the PNP bipolar transistor Q6, current between the emitter and collector of the PNP bipolar transistor Q6 is increased by the constant-current source I5 when base current for turning on the PNP bipolar transistor Q6 is generated by the constant-current source I4, and the PNP bipolar transistor Q6 is operated in an active region.

Figure 11:
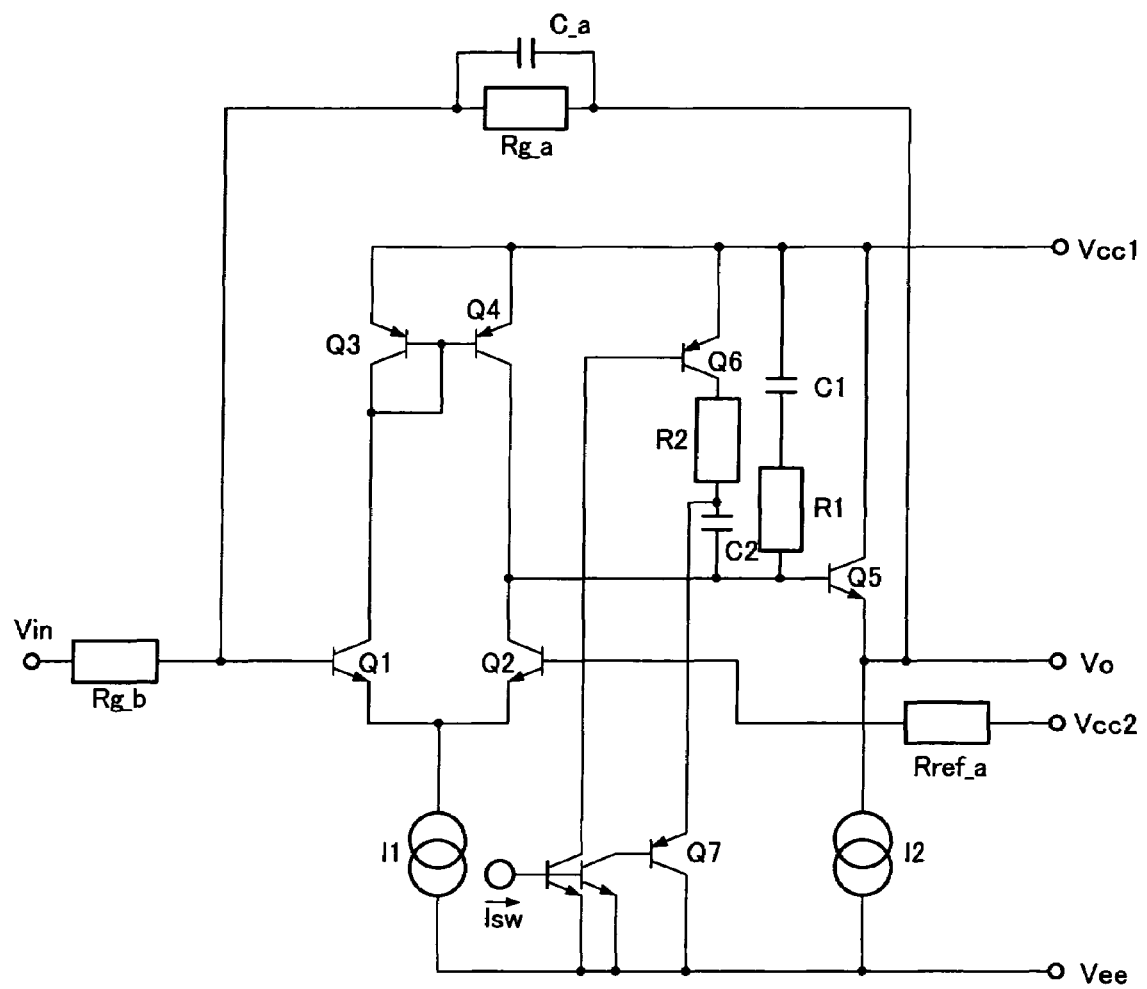
FIG. 11 is a diagram showing an example of the configuration of the amplifier unit according to Embodiment 1 of the present invention.

For example, in the amplifier unit configured as shown in FIG. 11, when base current for turning on the PNP bipolar transistor Q6 is generated, current between the emitter and collector of the PNP bipolar transistor Q6 is increased by a transistor Q7 operating as the constant-current source I5, and the PNP bipolar transistor Q6 is operated in an active region. By operating the transistor Q6 in an active region, an amplifier with excellent high-frequency characteristics is obtained, so that the amplifier is suitably operated at a higher frequency.

Figure 12:
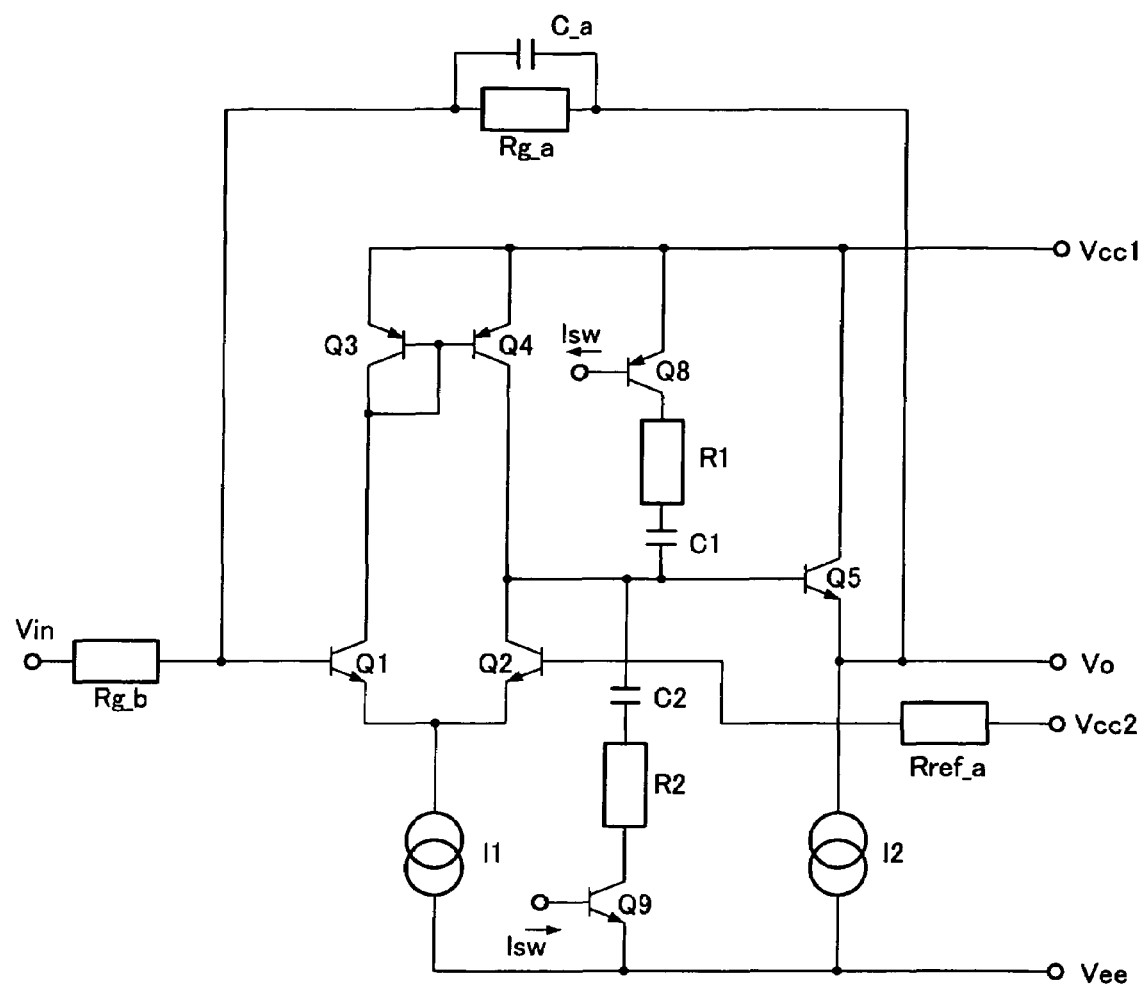
FIG. 12 is a diagram showing an example of the configuration of the amplifier unit according to Embodiment 1 of the present invention.

For example, the configuration of FIG. 12 is also applicable in which phase compensation circuits are connected between the signal line and the positive power supply line and between the signal line and the ground power supply line, bipolar transistors Q8 and Q9 used for switches are provided for the phase compensation circuits, and a PNP bipolar transistor Q8 and an NPN bipolar transistor Q9 are alternately turned on/off, so that one of the power supply lines can be selected for the passage of a signal. With this configuration, only the phase compensation circuit between the more stable one of the power supply lines and the signal line can be enabled according to, for example, the working conditions, thereby preventing the entry of noise from the outside and the interference of a signal.

The foregoing phase compensation circuit is connected to the signal line between the output section of the differential amplifier circuit (the collector of the transistor Q2) and the input section of the buffer (the base of the transistor Q5). When noise enters from the bases of the transistors Q6, Q8, and Q9 which are used as switches, the noise appears on the output signal of the amplifier as it is, resulting in lower SN ratio. Further, the transistors Q6, Q8, and Q9 are erroneously turned on/off.

Figure 13:
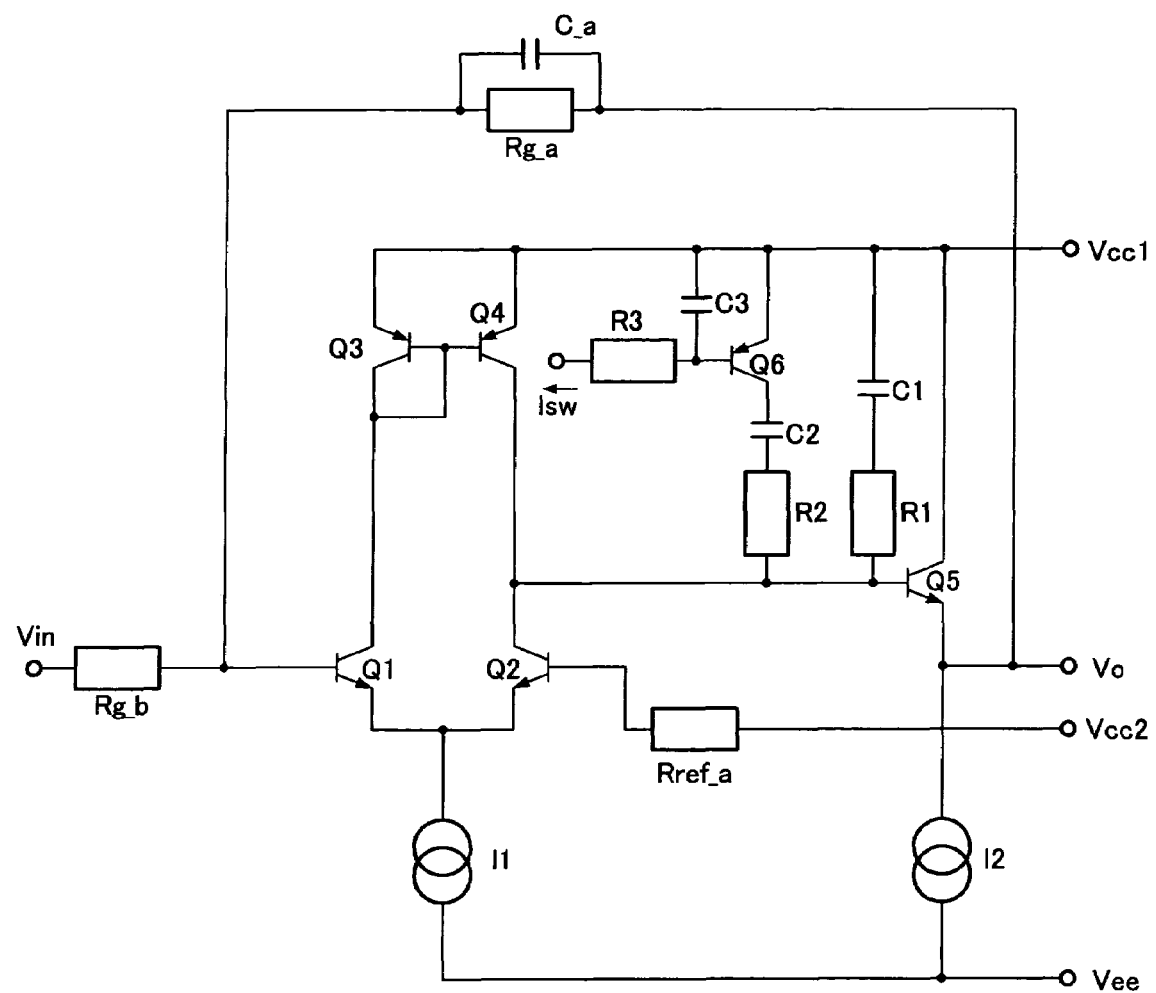
FIG. 13 is a diagram showing an example of the configuration of the amplifier unit according to Embodiment 1 of the present invention.

Therefore, for example as shown in FIG. 13, a low-pass filter including a resistor R3 and a capacitor C3 is connected to the base of the transistor Q6 for a switch, and noise entering the base of the transistor Q6 is attenuated to improve the SN ratio. Since this base line only handles direct current, the insertion of the low-pass filter does not cause any adverse effects.

Embodiment 1 described the case where the phase compensation sections are switched between the two modes. Needless to say, the phase compensation sections may be switched among three or more modes.

Embodiment 2

The following will describe an optical disc drive according to Embodiment 2.

The optical disc drive according to Embodiment 2 comprises a photoelectric conversion IC which includes a plurality of photo diodes PD each generating a current signal corresponding to the amount of light reflected from a loaded optical disc, a plurality of current-voltage converters each converting the current signal from the photo diode PD to a voltage signal, and an arithmetic section for performing operations using voltage signals from the current-voltage converters. In Embodiment 2, the current-voltage converter or the arithmetic section is configured using the amplifier unit described in Embodiment 1.

Figure 14:
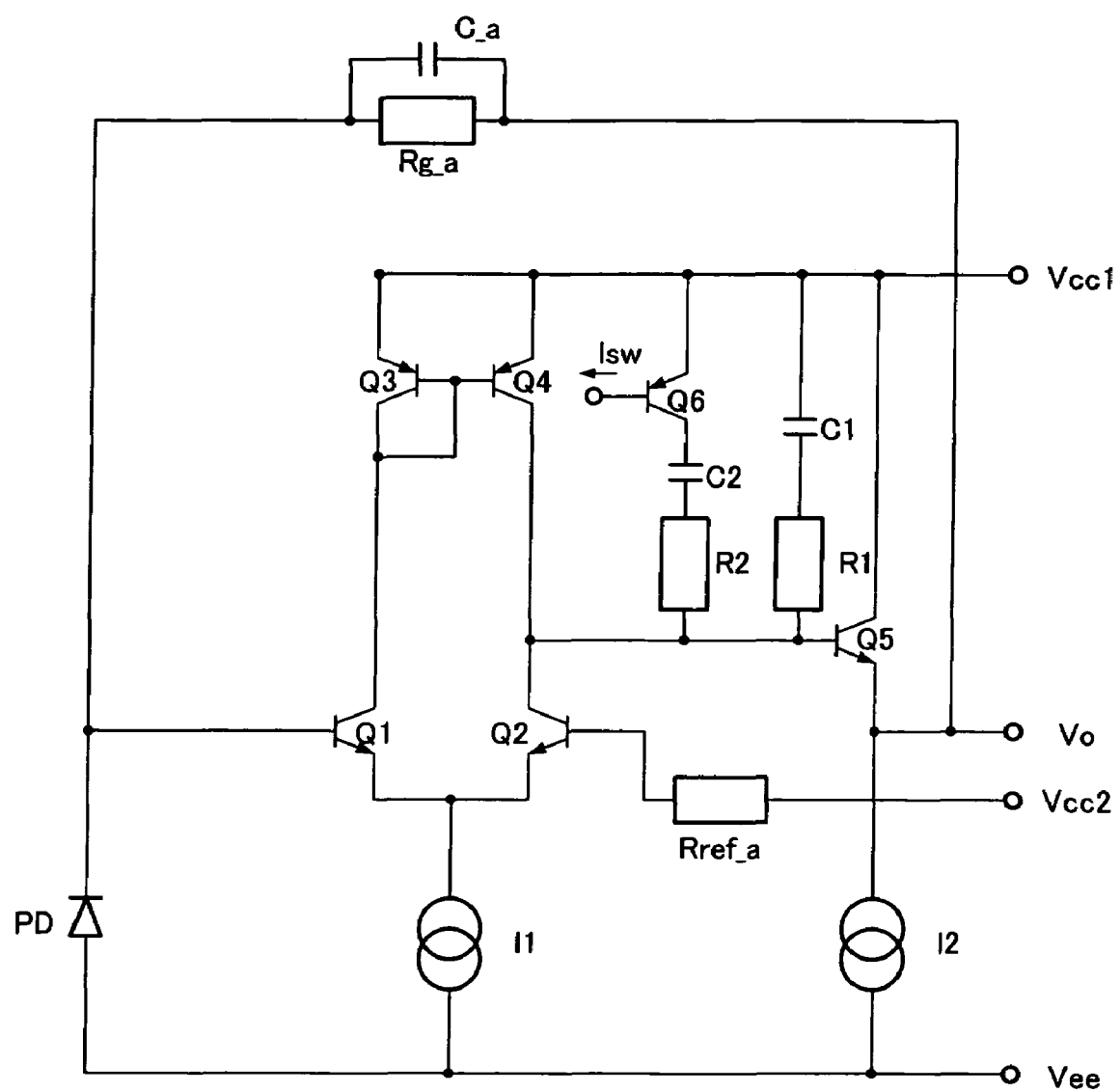
FIG. 14 is a diagram showing a structural example of a current-voltage converter included in a photoelectric conversion IC for an optical disc drive according to Embodiment 2 of the present invention.

FIG. 14 is a diagram showing an example of the configuration of the current-voltage converter included in the photoelectric conversion IC for the optical disc drive according to Embodiment 2. The current-voltage converter is configured using the amplifier unit of FIG. 1. A light-receiving current signal inputted from the photo diode PD to the inverting input terminal of an amplifier (the base of the transistor Q1) is converted to a voltage signal. In other words, the output voltage of the current-voltage converter is the product of feedback resistor Rg_a and current generated by light emitted to the photo diode PD.

Figure 15:
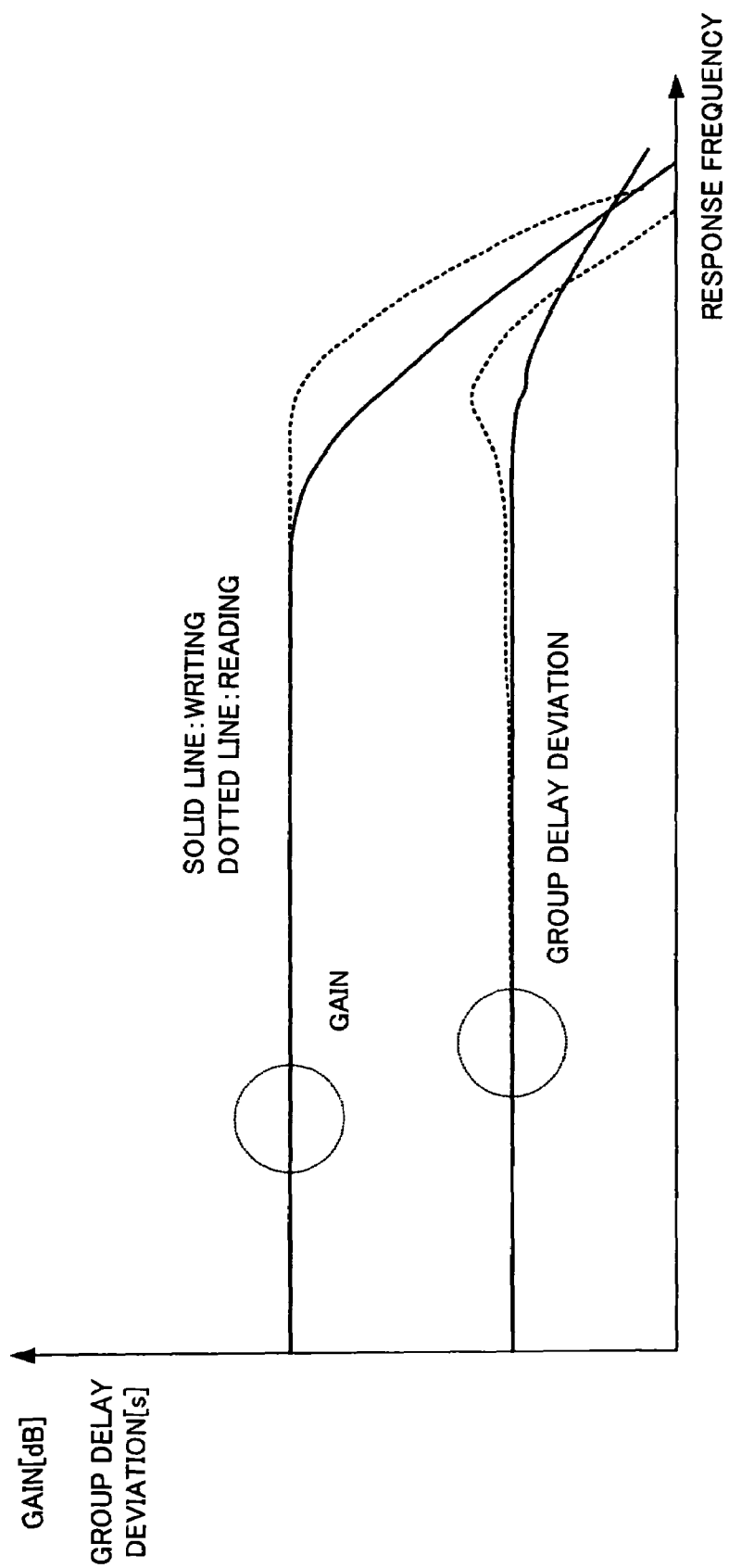
FIG. 15 is a diagram showing an example of frequency characteristics and a group delay deviation that are demanded of the photoelectric conversion IC for the optical disc drive.

When the frequency band is changed according to the type of loaded optical disc (the type of medium), as shown in FIG. 15, a flat group delay deviation which relates to the occurrence of ringing in pulse response is demanded rather than a wide frequency band during the writing of data on the optical disc. Hence, during the writing of data, the transistor Q6 for switching the resistance value and capacitance value of a phase compensation section is turned on, the pole of the phase compensation section is moved to the low-frequency side, and the group delay deviation of the output signal of the current-voltage converter (the output signal of the amplifier unit) is made smaller than that during the reading of data from the optical disc, so that the group delay deviation is flattened.

On the other hand, a wide frequency band is necessary during the reading of data. Thus the transistor Q6 is turned off, the pole of the phase compensation section is moved to a point where frequency characteristics start degrading, and the cut-off frequency of the output signal of the current-voltage converter is made higher than that during the writing of data to the optical disc, so that wide frequency characteristics with peaking are obtained as shown in FIG. 15.

The above explanation described the case where the amplifier unit of FIG. 1 is used. Needless to say, the other amplifier units described in Embodiment 1 may be used and the present embodiment is not limited to the illustrated amplifier units.

The above explanation also described the case where the resistance value and/or capacitance value of the phase compensation section is switched in the current-voltage converter. The same effect can be obtained in the following case: the amplifier unit described in Embodiment 1 is used for the arithmetic section for performing operations using voltage signals from the plurality of current-voltage converters, and the resistance value and/or capacitance value of the phase compensation section is switched in the arithmetic section.

Embodiment 3

Figure 16:
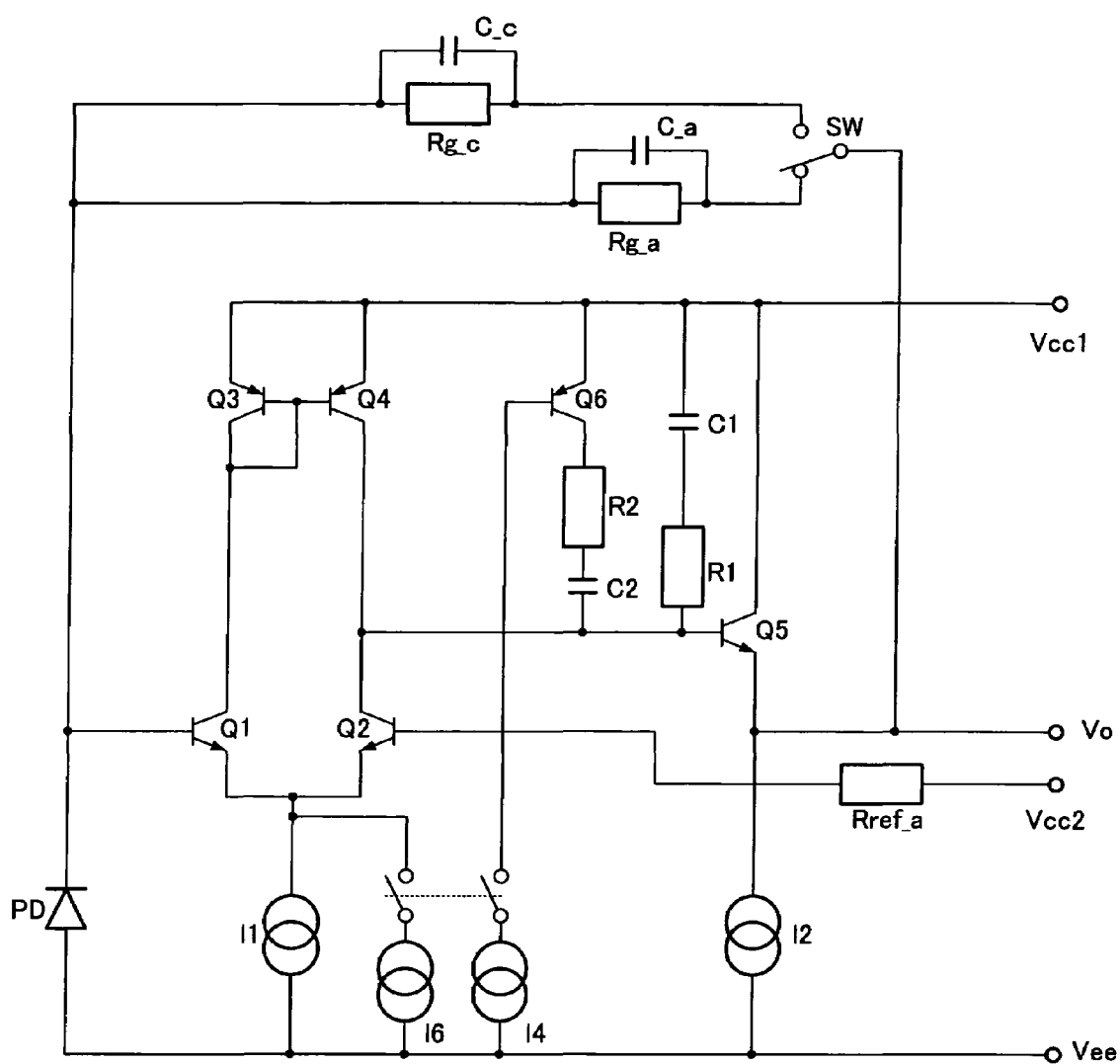
FIG. 16 is a diagram showing a structural example of a current-voltage converter included in a photoelectric conversion IC for an optical disc drive according to Embodiment 3 of the present invention.

FIG. 16 shows an example of the configuration of a current-voltage converter included in a photoelectric conversion IC for an optical disc drive according to Embodiment 3. The current-voltage converter can switch gains according to the type of loaded optical disc (the type of medium), thereby achieving a constant output voltage level for discs having different reflectivities.

In other words, in contrast to the current-voltage converter shown in FIG. 14, a feedback resistor section can switch a resistance value. To be specific, for example, as shown in FIG. 16, a feedback resistor is switched between a feedback resistor Rg_a and a feedback resistor Rg_c in response to the switching operation of a switch SW for switching a gain. Further, a feedback capacitor C_c is connected in parallel with the feedback resistor Rg_c to switch a feedback capacitance along with a gain.

With this configuration, the switch SW for switching a gain is turned on or off based on the type of optical disc identified by a medium type identification mechanism (not shown) of the optical disc drive, so that a constant output voltage level can be obtained for discs having different reflectivities. In other words, when an optical disc having a high reflectivity is loaded, the resistance value of the feedback resistor section is reduced. When an optical disc having a low reflectivity is loaded, the resistance value of the feedback resistor section is increased. Thus, a constant output voltage level is obtained.

Base current Isw of the transistor Q6 used for a switch for switching the resistance value and/or capacitance value of the phase compensation section is turned on/off in synchronization with the on/off of the switch SW for switching a gain, so that the feedback capacitance and the resistance value and/or capacitance value of the phase compensation section can be switched in synchronization with the switching of gains. It is thus possible to obtain optimal frequency characteristics in each gain mode.

Moreover, in Embodiment 3, a mechanism is provided for adjusting the bias current values of transistors Q1 and Q2, which are the input section of a differential amplifier circuit, based on the type of optical disc identified by the medium type identification mechanism (not shown).

For example, as shown in FIG. 16, a constant-current source 16 is provided to switch the bias current values of the transistors Q1 and Q2 in synchronization with the switching of gains. With this configuration, it is also possible to reduce noise and power consumption.

Optical disc drives of recent years operate at high speed and laser power emitted to optical discs increases accordingly. Thus, photoelectric conversion ICs for optical disc drives have increased in operating environment temperature. As the operating environment temperature increases, a capacitance value or resistance value in the amplifier unit fluctuates and the frequency characteristics change, so that oscillation may occur.

Figure 17:
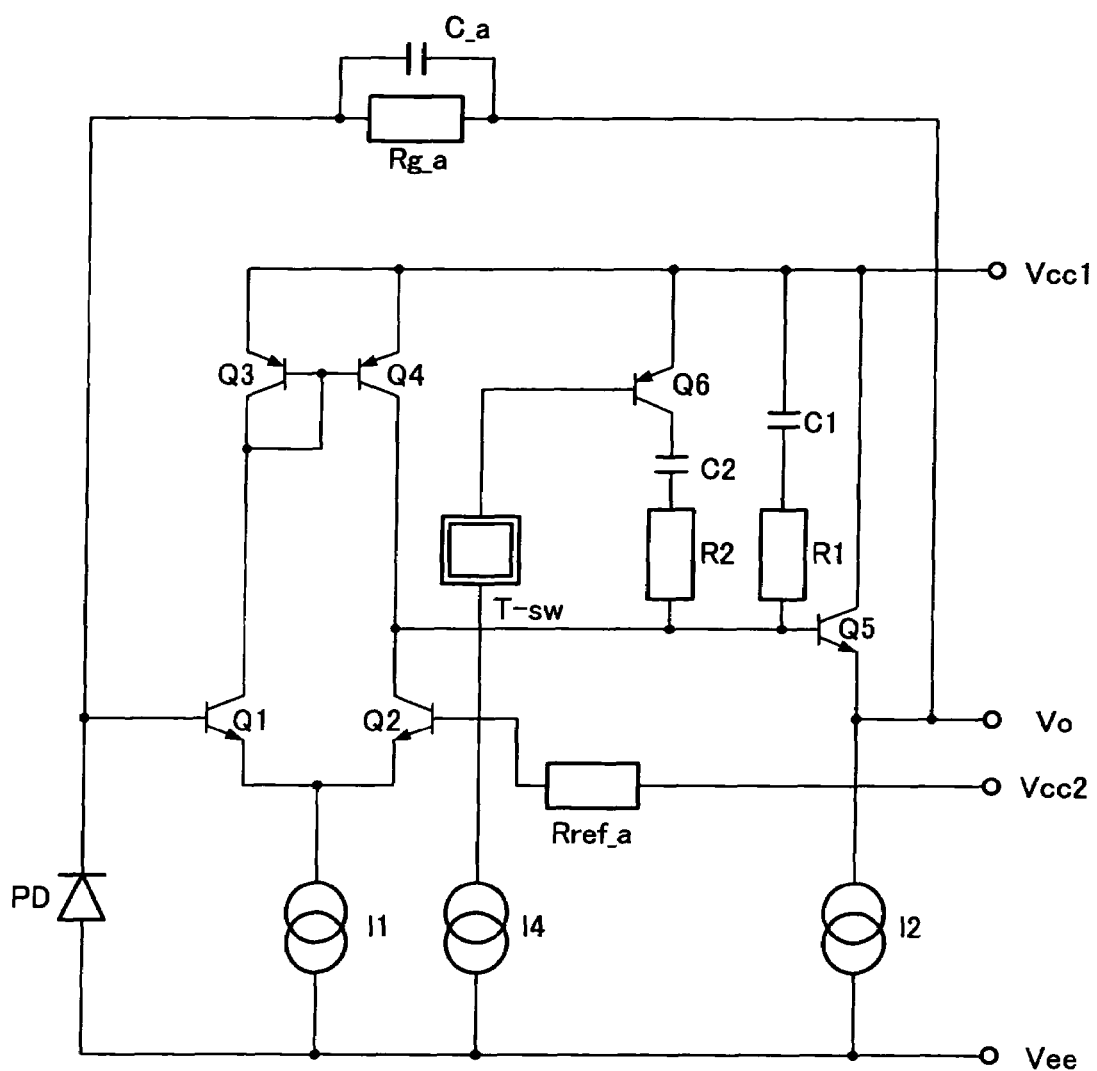
FIG. 17 is a diagram showing a structural example of the current-voltage converter included in the photoelectric conversion IC for the optical disc drive according to Embodiment 3 of the present invention.
Figure 18:
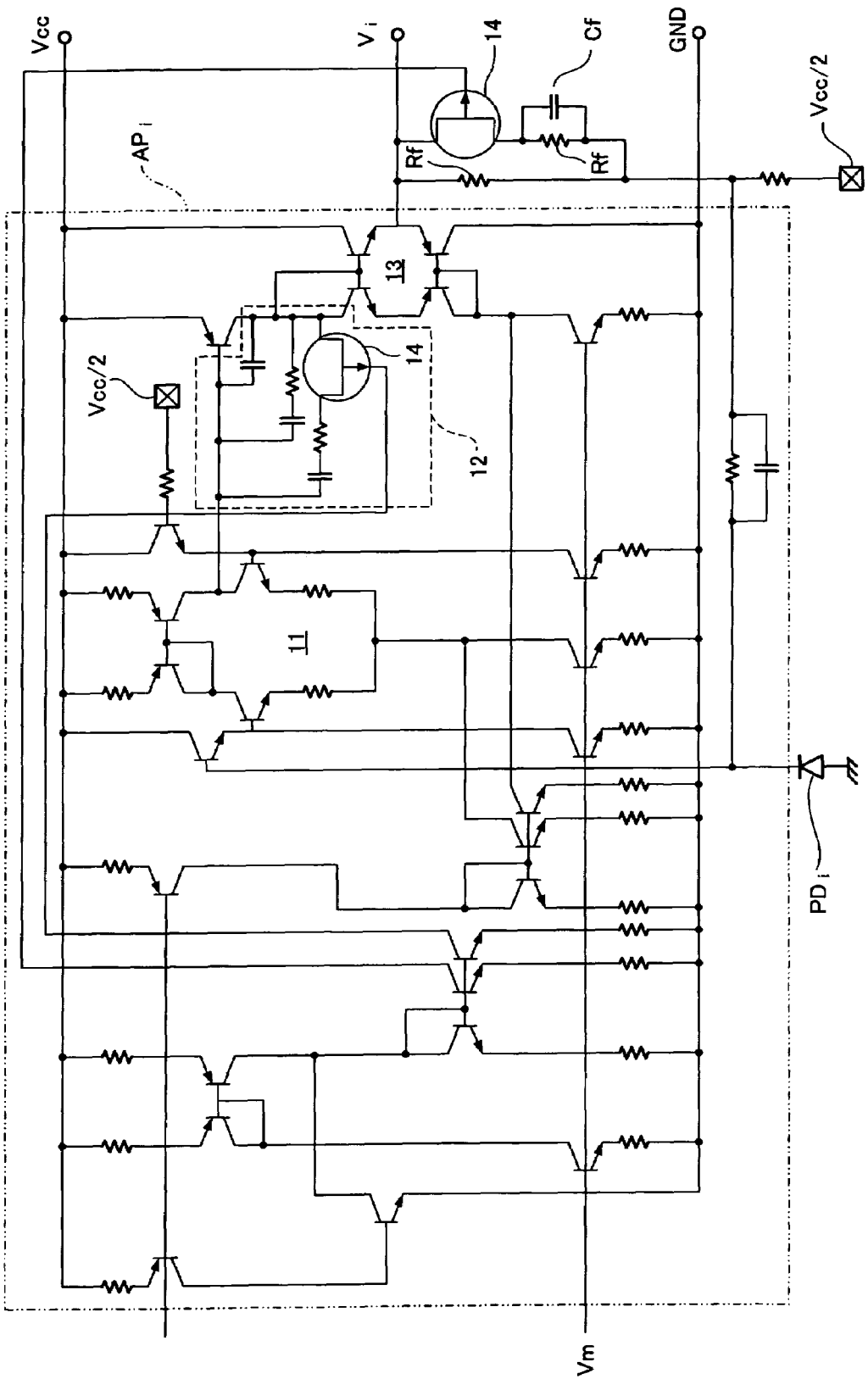
FIG. 18 is a circuit diagram showing an example of a current-voltage converter included in a conventional photoelectric conversion IC.

Therefore, a mechanism may be provided to switch, in response to a temperature change, the bipolar transistor for switching the resistance value and/or capacitance value of the phase compensation section. To be specific, as shown in FIG. 17, a thermistor T_SW is provided to turn off the transistor Q6 at a predetermined temperature or higher. In other words, the thermistor T_SW turns off the transistor Q6 at the predetermined temperature or higher to move the pole of the phase compensation section to a low-frequency region, so that a change of the frequency characteristics is reduced and oscillation is prevented. Although the thermistor is used in the present embodiment, the switching mechanism is not limited to a thermistor. Other temperature-dependent devices like a thermistor may be used.

The above explanation described the case where the amplifier unit of FIG. 1 is used. Needless to say, the other amplifier units described in Embodiment 1 may be used and the present embodiment is not limited to the illustrated amplifier units.

The above explanation described the case where the resistance value and/or capacitance value of the phase compensation section is switched in the current-voltage converter. The same effect can be obtained in the following case: the amplifier unit described in Embodiment 1 is used for the arithmetic section for performing operations using voltage signals from a plurality of current-voltage converters, and the resistance value and/or capacitance value of the phase compensation section is switched in the arithmetic section.

The amplifier unit of the present invention makes it possible to reduce the process cost of an IC including an amplifier circuit, and thus the present invention is useful for an optical pickup or the like for an optical disc.

Further, the optical disc drive of the present invention makes it possible to adjust frequency characteristics in response to the switching of gains, the switching of recording speeds, switching between reading and writing, and so on, and thus the present invention is useful for an optical disc drive which can respond to a variety of optical discs, various recording speeds, and reading/writing or the like.

What is claimed is:

1. An amplifier unit, comprising:
   a differential input section for receiving an input signal;
   a phase compensation section for performing phase compensation on a signal from the differential input section;
   an output section for receiving a signal which has been phase-compensated by the phase compensation section;
   a feedback resistor section for feeding back, to the differential input section, a signal outputted from the output section;
   a bipolar transistor for switching a resistance value and/or capacitance value of the phase compensation section; and
   a low-pass filter connected to a base of the bipolar transistor,
   wherein the amplifier unit, outputs from the output section, a signal obtained by amplifying the input signal by means of a predetermined amplification factor determined by a resistance value of the feedback resistor section.

2. An amplifier unit, comprising:
   a differential input section for receiving an input signal;
   a power supply line;
   a signal line for transmitting a signal from the differential input section;
   a phase compensation section including a plurality of phase compensation circuits between the power supply line and the signal line, and for performing phase compensation on the signal from the differential input section;
   an output section connected to signal line for receiving a signal which has been phase-compensated by the phase compensation section; and
   a feedback resistor section for feeding back, to the differential input section, a signal outputted from the output section,
   a bipolar transistor connected between the power supply line and a capacitor providing a capacitance value of at least one of the phase compensation circuits, the bipolar transistor switching a resistance value and/or capacitance value of the phase compensation section, and
   a current source connected to the bipolar transistor, the current source for operating in synchronization with the switching operation of the bipolar transistor and the signal line includes no base current components of the bipolar transistor, wherein the amplifier unit outputs from the output section, a signal obtained by amplifying the input signal by means of a predetermined amplification factor determined by a resistance value of the feedback resistor section, the power supply line is a positive power supply line and/or a ground power supply line, and the phase compensation circuits are between the signal line and the positive power supply line and/or the ground power supply line.

3. An amplifier unit comprising:
a differential input section for receiving an input signal;
a power supply line;
a signal line for transmitting a signal from the differential input section;
a phase compensation section including a plurality of phase compensation circuits between the power supply line and the signal line, and for performing phase compensation on a signal from the differential input section;
an output section connected to the signal line and receiving a signal which has been phase-compensated by the phase compensation section;
a feedback resistor section for feeding back, to the differential input section, a signal outputted from the output section;
a bipolar transistor connected between the power supply line and a capacitor providing a capacitance value of at least one of the phase compensation circuits, the bipolar transistor switching a resistance value and/or capacitance value of the phase compensation section; and
a current source connected between the bipolar transistor and the capacitor, the current source operating in synchronization with the switching operation of the bipolar transistors, and the bipolar transistor is operable in an active region when the bipolar transistor is turned on,
wherein the amplifier unit is for outputting, from the output section, a signal obtained by amplifying the input signal by means of a predetermined amplification factor determined by a resistance value of the feedback resistor section, the power supply line is a positive power supply line and/or a ground power supply line, and the phase compensation circuits are between the signal line and the positive power supply line and/or the ground power supply line.

4. An amplifier unit comprising:
a differential input section for receiving an input signal;
a power supply line;
a signal line for transmitting a signal from the differential input section;
a phase compensation section including a plurality of phase compensation circuits between the power supply line and the signal line, and for performing phase compensation on a signal from the differential input section;
an output section connected to the signal line and receiving a signal which has been phase-compensated by the phase compensation section;
a feedback resistor section for feeding back, to the differential input section. a signal outputted from the output section; and
a bipolar transistor connected between the power supply line and a capacitor providing a capacitance value of at least one of the phase compensation circuits, the bipolar transistor switching a resistance value and/or capacitance value of the phase compensation section,
wherein the amplifier unit output from the output section, a signal obtained by amplifying the input signal by means of a predetermined amplification factor determined by a resistance value of the feedback resistor section, the power supply line is a positive power supply line and a ground power supply line, the phase compensation circuits are respectively between the signal line and the positive power supply line and between the signal line and the ground power supply line, and the bipolar transistor is for each of the phase compensation circuits, whereby the phase compensation circuit connected to the positive power supply line and the phase compensation circuit connected to the ground power supply line are selectable by the bipolar transistor.

5. An optical disc drive responding to optical discs of a plurality of medium types, the optical disc drive comprising:
a photoelectric converter including a plurality of photo diodes each for generating a current signal corresponding to an amount of light reflected from a loaded optical disc;
a plurality of current-voltage converters each for converting the current signal from the photo diode to a voltage signal; and
an arithmetic section for performing an operation using a voltage signal from the current-voltage converter;
a mechanism for identifying a medium type of a loaded optical disc;
a mechanism for reducing a resistance value of the feedback resistor section when a loaded optical disc has a hiah reflectivity and increasing the resistance value of the feedback resistor section when a loaded optical disc has a low reflectivity, respectively based on a medium type identification result; and
a mechanism for adjusting, based on a medium type identification result of the loaded optical disc, a bias current value of a transistor receiving the input signal, the transistor forming a differential input section of the amplifier unit,
wherein one of the current-voltage converter and the arithmetic section includes the amplifier unit according to claim 1, and the feedback resistor section of the amplifier unit is a circuit for switching the resistance value.

6. The optical disc drive according to claim 5, further comprising a mechanism for causing the bipolar transistor of the amplifier unit to perform a switching operation in response to a temperature change.

7. The optical disc drive according to claim 5, wherein the bipolar transistor of the amplifier unit is switchable on/off, so that when data is written on a loaded optical disc, an output signal from the amplifier unit has a smaller group delay deviation than that during reading of data from such loaded optical disc, and when data is read a loaded optical disc, the output signal from the amplifier unit has a higher cutoff frequency than that during writing of data on such loaded optical disc.

* * * * *